(12) United States Patent
Bae et al.

(10) Patent No.: US 8,796,834 B2
(45) Date of Patent: Aug. 5, 2014

(54) STACK TYPE SEMICONDUCTOR PACKAGE

(75) Inventors: Jin Ho Bae, Icheon-si (KR); Qwan Ho Chung, Seoul (KR); Woong Sun Lee, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 475 days.

(21) Appl. No.: 13/118,714

(22) Filed: May 31, 2011

(65) Prior Publication Data

US 2011/0309504 A1 Dec. 22, 2011

(30) Foreign Application Priority Data

Jun. 16, 2010 (KR) .......................... 10-2010-0057058
May 3, 2011 (KR) .......................... 10-2011-0041740

(51) Int. Cl.
*H01L 23/522* (2006.01)
(52) U.S. Cl.
USPC ................... 257/686; 257/774; 257/E23.067; 257/E23.134
(58) Field of Classification Search
None
See application file for complete search history.

(56) References Cited

U.S. PATENT DOCUMENTS

2007/0018313 A1* 1/2007 Gomyo et al. ................ 257/723
2009/0250822 A1* 10/2009 Chen et al. .................... 257/777
2010/0019368 A1* 1/2010 Shin .............................. 257/686

FOREIGN PATENT DOCUMENTS

KR 1020010061796 A 7/2001
KR 1020020031610 A 5/2002
KR 1020050051047 A 6/2005

* cited by examiner

*Primary Examiner* — Wensing Kuo
(74) *Attorney, Agent, or Firm* — William Park & Associates Patent Ltd.

(57) ABSTRACT

A stack package includes a core layer having a first surface and a second surface, and including first circuit wiring lines; a first semiconductor device disposed on the second surface of the core layer; a first resin layer formed on the second surface of the core layer to cover the first semiconductor device; second circuit wiring lines formed on the first resin layer and electrically connected with the first semiconductor device; a second semiconductor device disposed over the first resin layer including the second circuit wiring lines and electrically connected with the second circuit wiring lines; a second resin layer formed on the second circuit wiring lines and the first resin layer to cover the second semiconductor device; and a plurality of via patterns formed to pass through the first resin layer and the core layer and electrically connecting the first circuit wiring lines and the second circuit wiring lines.

10 Claims, 3 Drawing Sheets

STACK TYPE SEMICONDUCTOR PACKAGE

CROSS-REFERENCE TO RELATED APPLICATIONS

The present application claims priorities to Korean patent application number 10-2010-0057058 filed on Jun. 16, 2010 and 10-2011-0041740 filed on May 3, 2011, which are incorporated herein by reference in their entireties.

BACKGROUND OF THE INVENTION

The present invention relates to a stack package which is suitable for processing data at a high speed and can realize a slim structure.

As semiconductor device manufacturing technologies have developed, semiconductor packages having semiconductor devices are increasingly capable of processing an increased amount of data within a short time.

Semiconductor packages are manufactured through a process for manufacturing semiconductor chips on a wafer formed of silicon with high purity, a die sorting process for electrically inspecting the semiconductor chips, and an assembly process for packaging the semiconductor chips that pass inspection.

A chip scale package have recently been developed, where the package has a size no greater than about 100% to 105% of the size of a semiconductor chip, and a stack package, in which a plurality of semiconductor chips are stacked.

The stack package provides an advantage in that it can significantly increase data storage capacity. However, the stack package encounters a problem in that the data processing speed markedly decreases due to deviations in the processing speeds of signals to be inputted and outputted to and from the respective semiconductor chips included in the stack package.

Moreover, a structure has been adopted, in which an additional sub-substrate is inserted in an effort to manufacture a stack package capable of processing data at a high speed. In this regard, in the course of attaching semiconductor chips to an upper surface and a lower surface of the sub-substrate, poor connections may be formed in joints due to the warpage of the sub-substrate.

BRIEF SUMMARY OF THE INVENTION

An embodiment of the present invention is directed to a slim structured stack package suitable for processing data at a high speed.

In one embodiment of the present invention, a stack package includes: a core layer having a first surface and a second surface opposite the first surface, and including first circuit wiring lines formed on the first surface; a first semiconductor device disposed on the second surface of the core layer; a first resin layer formed on the second surface of the core layer to cover the first semiconductor device; second circuit wiring lines formed on the first resin layer and electrically connected with the first semiconductor device; a second semiconductor device disposed over the first resin layer including the second circuit wiring lines and electrically connected with the second circuit wiring lines; a second resin layer formed on the second circuit wiring lines and the first resin layer to cover the second semiconductor device; and a plurality of via patterns passing through the first resin layer and the core layer and electrically connecting the first circuit wiring lines and the second circuit wiring lines.

The first resin layer may be one of resin and EMC (epoxy molding compound).

The second resin layer may be one of resin and EMC.

Each of the first and second semiconductor devices may be one of a semiconductor chip and a semiconductor package.

The first semiconductor device may include first bonding pads and first bumps formed on the first bonding pads to be electrically connected with the second circuit wiring lines, and the second semiconductor device may include second bonding pads and second bumps formed on the second bonding pads to be electrically connected with the second circuit wiring lines.

The second circuit wiring lines may include: a plurality of first traces extending from substantially a middle portion to a first edge of the first resin layer, and having first terminal parts near a middle portion and electrically connected with the first semiconductor device, and second terminal parts near the first edge and electrically connected with corresponding via patterns; and a plurality of second traces extending from near a middle portion, separated from the first traces, to a second edge, opposite the first edge, of the first resin layer, and having third terminal parts near a middle portion and electrically connected with the second semiconductor device and fourth terminal parts near the second edge and electrically connected with corresponding via patterns.

Distances between each of the first terminal parts and its corresponding second terminal part may be the same, and the distance between each of the third terminal parts and its corresponding fourth terminal part may be the same, and the distance between the first terminal part and the second terminal part and the distance between the third terminal part and the fourth terminal part may be the same.

The first circuit wiring lines formed on the first surface of the core layer may include ball lands.

The core layer may include a solder mask formed on the first surface to cover the first circuit wiring lines excluding the ball lands.

The stack package may further include external mounting members attached to the ball lands.

In another embodiment of the present invention, a stack package includes: a core layer having a first surface and a second surface opposite the first surface, and including first circuit wiring lines formed on the first surface; at least two unit packages stacked on the second surface of the core layer; and via patterns formed to pass through the core layer and at least one of the stacked unit packages, each unit package including: a first semiconductor device; a first resin layer formed to cover upper and side surfaces of the first semiconductor device; second circuit wiring lines formed on the first resin layer and electrically connected with the first semiconductor device; a second semiconductor device disposed over the first resin layer including the second circuit wiring lines and electrically connected with the second circuit wiring lines; and a second resin layer formed on the second circuit wiring lines and the first resin layer to cover lower and side surfaces of the second semiconductor device, wherein the via patterns pass through the core layer, at least one of the first and second resin layers, and the second circuit wiring lines of the stacked unit packages, and electrically connect the first circuit wiring lines with the second circuit wiring lines of the stacked unit packages.

The first resin layer may include at least one of resin and EMC.

The second resin layer may include at least one of resin and EMC.

Each of the first and second semiconductor devices may include at least one of a semiconductor chip and a semiconductor package.

The first semiconductor device may include first bonding pads and first bumps formed on the first bonding pads to be electrically connected with the second circuit wiring lines; and the second semiconductor device may include second bonding pads and second bumps formed on the second bonding pads to be electrically connected with the second circuit wiring lines.

The second circuit wiring lines may include: a plurality of first traces extending from substantially a middle portion to a first edge of the first resin layer, and having first terminal parts near a middle portion and electrically connected with the first semiconductor device, and second terminal parts disposed near the first edge and electrically connected with corresponding via patterns; and a plurality of second traces extending from substantially a middle portion, separated from the first traces, to near a second edge facing away from the first edge, of the first resin layer, and having third terminal parts near a middle portion and electrically connected with the second semiconductor device and fourth terminal parts near the second edge and electrically connected with corresponding via patterns.

Distance between each of the first terminal parts and its corresponding second terminal part may be the same, and the distance between the third terminal parts and its corresponding fourth terminal part may be the same, and the distance between the first terminal part and the second terminal part and the distance between the third terminal part and the fourth terminal part may be the same.

The first circuit wiring lines formed on the first surface of the core layer may include ball lands.

The core layer may include a solder mask formed on the first surface to cover the first circuit wiring lines excluding the ball lands.

The stack package may further include external mounting members attached to the ball lands.

DESCRIPTION OF SPECIFIC EMBODIMENTS

Hereafter, specific embodiments of the present invention will be described in detail with reference to the accompanying drawings.

It is to be understood that the drawings are not necessarily to scale and in some instances proportions may have been exaggerated in order to more clearly depict certain features of the invention.

Figure 1:
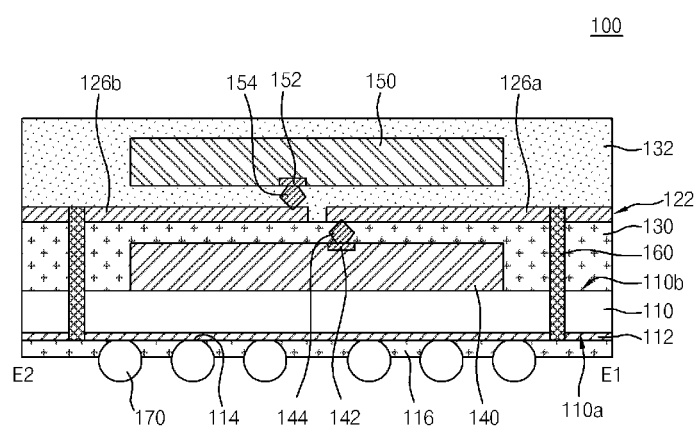
FIG. 1 is a cross-sectional view illustrating a stack package in accordance with an embodiment of the present invention.
Figure 2:
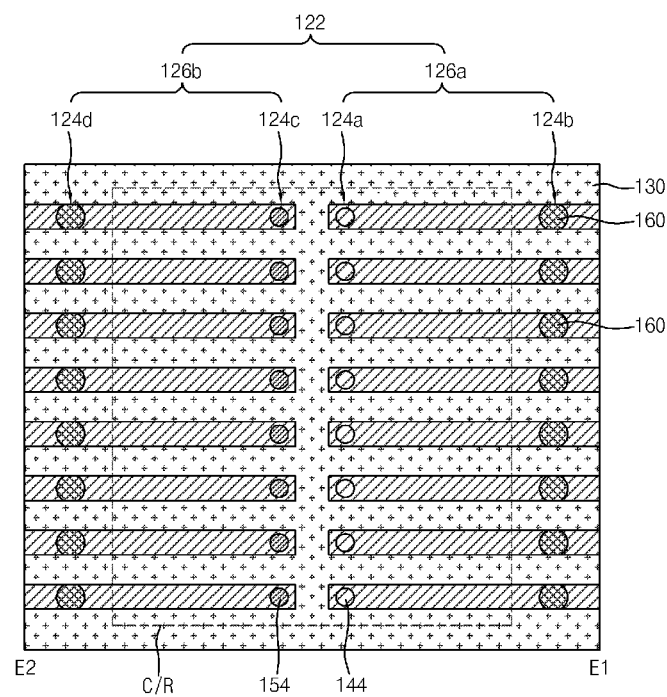
FIG. 2 is a plan view illustrating the electrical connection relationship among component elements in the stack package shown in FIG. 1.

FIG. 1 is a cross-sectional view illustrating a stack package in accordance with an embodiment of the present invention, and FIG. 2 is a plan view illustrating the electrical connection relationship among component elements in the stack package shown in FIG. 1.

Referring to FIG. 1, a stack package 100 in accordance with an embodiment of the present invention includes a core layer 110, first and second resin layers 130 and 132, first and second semiconductor devices 140 and 150, second circuit wiring lines 122, and via patterns 160.

The core layer 110 has a first surface 110a and a second surface 110b opposite the first surface 110a. The core layer 110 includes first circuit wiring lines 112 on the first surface 110a and ball lands 114. A solder mask 116 is formed on the first surface 110a in such a way as to cover the first circuit wiring lines 112 excluding the ball lands 114.

The first semiconductor device 140 may be a semiconductor chip or a semiconductor package. FIG. 1 exemplifies the case where the first semiconductor device 140 is a semiconductor chip. First bonding pads 142 are disposed on an upper surface of the first semiconductor device 140. The first semiconductor device 140 may be placed face-up on the second surface 110b of the core layer 110 in such a manner that the first bonding pads 142 are disposed to face away from the second surface 110b of the core layer 110. The first semiconductor device 140 may have, for example, a quadrangular plate-like shape and may include a first circuit unit (not shown) formed therein. The first circuit unit may be connected with the first bonding pads 142. The first circuit unit may include a data storage section for storing data and a data processing section for processing data. The first semiconductor device 140 may include first bumps 144 formed on the first bonding pads 142 to be electrically connected with the second circuit wiring lines 122 which will be described later in detail.

The first resin layer 130 is formed on the second surface 110b of the core layer 110 in such a way as to cover the first semiconductor device 140. The first resin layer 130 may include, for example, resin or an EMC (Epoxy Molding Compound).

The second circuit wiring lines 122 are formed on the first resin layer 130 and are electrically connected with the first semiconductor device 140. In detail, the second circuit wiring lines 122 include first traces 126a and second traces 126b which extend respectively to first edge E1 and first edge E2 of the first resin layer 130. The first traces 126a have first terminal parts 124a (FIG. 2) disposed adjacent to a middle portion of the first resin layer 130 and are electrically connected with the first semiconductor device 140. The first traces 126a also have second terminal parts 124b (FIG. 2) disposed adjacent to the first edge E1 and which are electrically connected with corresponding via patterns 160.

The second traces 126b have third terminal parts 124c (FIG. 2) disposed adjacent to a middle portion of the first resin layer 130 and are electrically connected with the second semiconductor device 150. The second traces 126b also have fourth terminal parts 124d (FIG. 2) disposed adjacent to the second edge E2 and which are electrically connected with corresponding via patterns 160. As will be described later in detail, the first terminal parts 124a of the first traces 126a are electrically connected with the first bonding pads 142 of the first semiconductor device 140 by means of the first bumps 144, and the third terminal parts 124c of the second traces 126b are electrically connected with second bonding pads 152 of the second semiconductor device 150 by means of second bumps 154.

The second semiconductor device 150 may be a semiconductor chip or a semiconductor package. FIG. 1 exemplifies the case where the second semiconductor device 150 is a semiconductor chip. The second bonding pads 152 are disposed on the middle portion of the upper surface of the second semiconductor device 150 includes. The second semiconductor device 150 is placed face-down over the first resin layer 130 such that the second bonding pads 152 are disposed to face the second surface 110b of the core layer 110 to be electrically connected with the second circuit wiring lines 122.

For example, the second bonding pads 152 may be disposed in such a type as to be obliquely opposite to the first bonding pads 142 of the first semiconductor device 140 with the second circuit wiring lines 122 in between. The second semiconductor device 150 has, for example, a quadrangular plate-like shape and includes a second circuit unit (not shown) formed therein. The second circuit unit may be connected with the second bonding pads 152. The second circuit unit may include a data storage section for storing data and a data processing section for processing data.

The second resin layer 132 is formed to cover the second semiconductor device 150. The second resin layer 132 may include resin or an EMC.

The via patterns 160 are formed to pass through the first resin layer 130 and the core layer 110, are disposed near the first edge E1 and the second edge E2, and electrically connect the first circuit wiring lines 112 and the second circuit wiring lines 122. The via patterns 160 may be formed, for example, by defining via holes (not shown) to pass through portions of the first resin layer 130 and the core layer 110 on both sides of the first semiconductor device 140, through laser drilling or dry etching, and then by filling a metallic material in the via holes through a plating process. The via holes may be defined to pass through the first and second circuit wiring lines 112 and 122. A material having excellent electrical conductivity such as copper may be used as the metallic material.

In addition, the stack package 100 in accordance with an embodiment of the present invention may further include external mounting members 170 attached to the ball lands 114 of the core layer 110. The external mounting members 170 may include, for example, solder balls.

In the stack package 100 in accordance with an embodiment of the present invention, the first and second semiconductor devices 140 and 150 are flip-chip bonded to face each other with the second circuit wiring lines 122 in between. The first semiconductor device 140 is electrically connected to the second circuit wiring lines 122 by the first bumps 144 attached to the first bonding pads 142. The first bumps 144 may include, for example, solders or gold (Au) studs. Similarly, the second semiconductor device 150 is electrically connected to the second circuit wiring lines 122 by the second bumps 154 attached to the second bonding pads 152. The second bumps 154 may include the same material as the first bumps 144.

In detail, FIG. 2 is a plan view explaining the electrical connection relationship among component elements in the stack package shown in FIG. 1. The electrical connection relationship will be described below.

Referring to FIG. 2, the second circuit wiring lines 122 which are disposed on the upper surface of the first resin layer 130 include the plurality of first traces 126a and the plurality of second traces 126b which are separated from each other. The first traces 126a and the second traces 126b extend respectively from a middle portion of the first resin layer 130 to the first edge E1 and the second edge E2. The first traces 126a includes the first terminal part 124a disposed near the middle portion and the second terminal part 124b disposed near the first edge E1. The second traces 126b include the third terminal part 124c near the middle portion and the fourth terminal part 124d near the second edge E2.

The distances between the first terminal parts 124a and the second terminal parts 124b in the first traces 126a may be the same with one another, and the distances between the third terminal parts 124c and the fourth terminal parts 124d in the second traces 126b may be the same with one another. Further, the distance between the first terminal part 124a and the second terminal part 124b and the distance between the third terminal part 124c and the fourth terminal part 124d may be the same with each other.

The first semiconductor device 140 is placed under the lower surfaces of the second circuit wiring lines 122 in a chip attachment region C/R. Electrical connections are made from the first semiconductor device 140 to the second circuit wiring lines 122 by the first bonding pads 142 and the first traces 126a. The first bumps 144 attached to the first bonding pads 142 are coupled to the first terminal parts 124a of the first traces 126a.

The second semiconductor device 150 is placed over the upper surfaces of the second circuit wiring lines 122 in the chip attachment region C/R. Electrical connections are made from the second semiconductor device 150 and the second circuit wiring lines 122 by the second bonding pads 152 and the second traces 126b. The second bumps 154 attached to the second bonding pads 152 are coupled to the third terminal parts 124c of the second traces 126b.

Accordingly, in a stack package in accordance with an embodiment of the present invention, since electrical connection paths between first and second semiconductor devices are made in the same way, it is possible to prevent problems from being caused due to signal path delay. Also, because electrical connections between a core layer and the first and second semiconductor devices are implemented by the medium of via patterns, signal transmission paths are shortened correspondingly, whereby it is possible to realize a structure suitable for processing data at a high speed. Moreover, in the stack package in accordance with an embodiment of the present invention, since the first semiconductor device is inserted into a first resin layer covering the core layer so that the stack package is manufactured in an embedded type, a slim structure can be accomplished.

Although it was described in the above embodiment of the present invention that the second circuit wiring lines include the plurality of first traces and the plurality of second traces which are separated from each other, various other shapes of the second circuit wiring lines may be adopted. For example, in the case where the first semiconductor device and the second semiconductor device are the same kind and the same signals are inputted to the first bonding pads 142 and the second bonding pads 152 which are disposed to face each other, the second circuit wiring lines may be constituted by single traces which extend from a first edge to a second edge, without being divided into two parts. In this case, first terminal parts connected with the first semiconductor device and the third terminal parts connected with the second semiconductor device may be integrated with each other.

Figure 3:
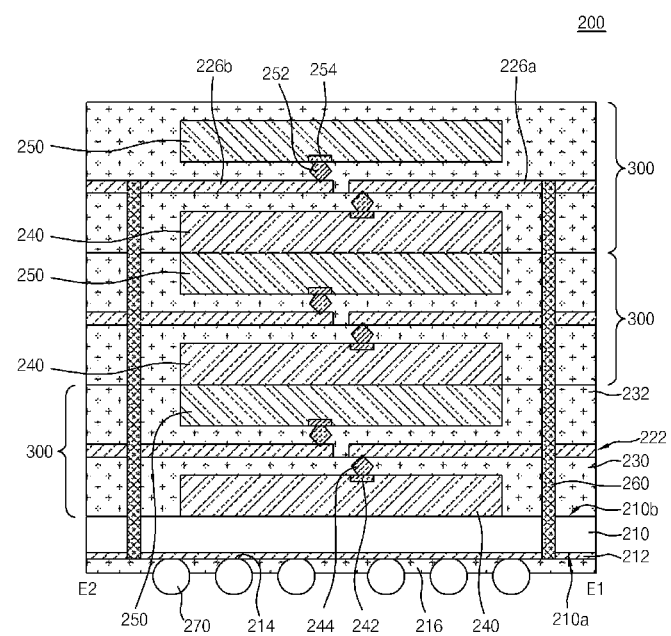
FIG. 3 is a cross-sectional view illustrating a stack package in accordance with another embodiment of the present invention.

FIG. 3 is a cross-sectional view illustrating a stack package in accordance with another embodiment of the present invention.

Referring to FIG. 3, a stack package 200 in accordance with another embodiment of the present invention includes a core layer 210, at least two unit packages 300 stacked on the core layer 210, and via patterns 260 which electrically connect the core layer 210 and the stacked unit packages 300. In FIG. 3, there are shown three unit packages 300.

The core layer 210 has a first surface 210a and a second surface 210b opposite the first surface 210a. The core layer 210 includes first circuit wiring lines 212 on the first surface 210a and ball lands 214. A solder mask 216 is formed on the first surface 210a in such a way as to cover the first circuit wiring lines 212 excluding the ball lands 214.

Each of the stacked unit packages 300 includes first and second resin layers 230 and 232, first and second semiconductor devices 240 and 250, and second circuit wiring lines 222. Each of the first and second semiconductor devices 240 and 250 may be a semiconductor chip or a semiconductor package. FIG. 3 exemplifies the case where the first and second semiconductor devices 240 and 250 are semiconductor chips.

The first semiconductor device 240 of a unit package 300 lowermost among the stacked unit packages 300 is placed face-up on the second surface 210b of the core layer 210. Thus, first bonding pads 242, which are disposed on the upper surface of the first semiconductor device 240 in the lowermost unit package 300, face away from the second surface 210b of the core layer 210. Similarly, first semiconductor devices 240 of the respective unit packages 300 are placed face-up such that first bonding pads 242 of the respective first semiconductor devices 240 face away from the second surface 210b of the core layer 210.

Each first resin layer 230 is formed in such a way as to cover the upper surface and the side surfaces of each first semiconductor device 240. The first resin layer 230 may include, for example, resin or an EMC.

The second circuit wiring lines 222 are formed on the upper surface of the first resin layer 230 and are electrically connected with the first semiconductor device 240. Similarly to the aforementioned embodiment in FIGS. 1 and 2, the second circuit wiring lines 222 in each unit package 300 include a plurality of first traces 226a and a plurality of second traces 226b. Each of the first traces 226a has a first terminal part and a second terminal part, and each of the second traces 226b has a third terminal part and a fourth terminal part.

Each second semiconductor device 250 is placed face-down over the first resin layer 230 including the second circuit wiring lines 222 so as to be electrically connected with the second circuit wiring lines 222. Accordingly, second bonding pads 252, which are formed on the upper surface of each second semiconductor device 250, are disposed in such a way as to be obliquely opposite to the first bonding pads 242 of the first semiconductor device 240 with the second circuit wiring lines 222 in between.

Each second resin layer 232 is formed on the second circuit wiring lines 222 and the first resin layer 230 in such a way as to cover the second semiconductor device 250. The second resin layer 232 may include the same resin as the first resin layer 230. Generally, the second resin layer 232 may include either resin or EMC. In this regard, the second resin layer 232 of a unit package 300, which is positioned uppermost among the at least two stacked unit packages 300, may be formed of an EMC, and the second resin layers 232 of the remaining unit packages 300 may be formed of resin.

The via patterns 260 are formed to pass through the core layer 210 and the first and second resin layers 230 and 232 of the respective unit packages 300, and electrically connect the first circuit wiring lines 212 disposed on the first surface 210a of the core layer 210 with the second circuit wiring lines 222 of the respective unit packages 300. Such via patterns 260 may be formed, for example, by defining via holes (not shown) to pass through the core layer 210 and the first and second resin layers 230 and 232 which cover the first and second semiconductor devices 240 and 250, through laser drilling or dry etching, and then by filling a metallic material in the via holes through a plating process. The via holes may be defined to pass through the first and second circuit wiring lines 212 and 222. In one embodiment, the via holes may be defined to pass through the second resin layer 232 in the unit package 300 which is positioned uppermost among the stacked unit packages 300, while in another embodiment the via holes may be defined so as not to pass through the second resin layer 232 in the uppermost unit package 300.

In addition, the stack package 200 in accordance with an embodiment of the present invention may further include external mounting members 270 attached to the ball lands 214 of the core layer 210. The external mounting members 270 may include, for example, solder balls.

Also, although it was described that the second circuit wiring lines 222 include the plurality of first traces and the plurality of second traces separated from each other, the second circuit wiring lines 222 may comprise single traces that extend from a first edge to a second edge without a break as shown previously. Of course, in this case, first terminal parts connected with the first semiconductor device and the third terminal parts connected with the second semiconductor device may be understood as being integrated with each other.

Since the stack package 200 in accordance with an embodiment of the present invention is realized such that at least two unit packages are stacked on the core layer, the stack package 200 can have a larger capacity than that of the embodiment described in FIGS. 1 and 2.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:
1. A stack package comprising:
 a core layer having a first surface and a second surface opposite the first surface, and including first circuit wiring lines formed on the first surface;
 at least two unit packages stacked on the second surface of the core layer; and
 via patterns passing through the core layer and at least one of the stacked unit packages,
 each unit package comprising:
 a first semiconductor device having first bonding pads and first bumps formed on the first bonding pads;
 a first resin layer formed to cover upper and side surfaces of the first semiconductor device;
 second circuit wiring lines formed on the first resin layer and electrically connected with the first semiconductor device by the first bumps formed on the first bonding pads;
 a second semiconductor device disposed over the first resin layer including the second circuit wiring lines, and electrically connected with the second circuit wiring lines; and
 a second resin layer formed on the second circuit wiring lines and the first resin layer to cover lower and side surfaces of the second semiconductor device,
 wherein the via patterns pass through the core layer, the first and second resin layers, and the second circuit wiring lines of at least one of the stacked unit packages, and
 wherein the via patterns do not to pass through the second resin layer in an uppermost unit package which is positioned uppermost among the stacked unit packages.

2. The stack package according to claim 1, wherein the first resin layer comprises one of resin and EMC.

3. The stack package according to claim 1, wherein the second resin layer comprises one of resin and EMC.

4. The stack package according to claim 1, wherein each of the first and second semiconductor devices comprises one of a semiconductor chip and a semiconductor package.

5. The stack package according to claim 1,
wherein the second semiconductor device comprises second bonding pads and second bumps formed on the second bonding pads to be electrically connected with the second circuit wiring lines.

6. The stack package according to claim 1, wherein the second circuit wiring lines comprise:
a plurality of first traces extending from substantially a middle portion to a first edge of the first resin layer, and having first terminal parts disposed near the middle portion and electrically connected with the first semiconductor device, and second terminal parts disposed near the first edge and electrically connected with corresponding via patterns; and
a plurality of second traces extending from substantially a middle portion, separated from the first traces, to a second edge opposite the first edge, of the first resin layer, and having third terminal parts disposed near the middle portion and electrically connected with the second semiconductor device, and fourth terminal parts disposed near the second edge and electrically connected with corresponding via patterns.

7. The stack package according to claim 6, wherein a distance between each the first terminal parts and its corresponding second terminal part is the same, and a distance between each of the third terminal parts and its corresponding fourth terminal part is the same, and the distance between the first terminal part and the second terminal part is the same as the distance between the third terminal part and the fourth terminal part.

8. The stack package according to claim 1, wherein the first circuit wiring lines formed on the first surface of the core layer include ball lands.

9. The stack package according to claim 8, wherein the core layer includes a solder mask formed on the first surface to cover the first circuit wiring lines excluding the ball lands.

10. The stack package according to claim 9, further comprising:
external mounting members attached to the ball lands.

* * * * *